US012342504B2

(12) United States Patent
Huang et al.

(10) Patent No.: US 12,342,504 B2
(45) Date of Patent: Jun. 24, 2025

(54) THERMAL MANAGEMENT DEVICES

(71) Applicant: Hewlett-Packard Development Company, L.P., Spring, TX (US)

(72) Inventors: Hendry Huang, Taipei (TW); Kuan-Ting Wu, Taipei (TW); Chi Hao Chang, Taipei (TW)

(73) Assignee: Hewlett-Packard Deveopment Company, L.P., Spring, TX (US)

( * ) Notice: Subject to any disclaimer, the term of this patent is extended or adjusted under 35 U.S.C. 154(b) by 144 days.

(21) Appl. No.: 18/011,484

(22) PCT Filed: Jul. 23, 2020

(86) PCT No.: PCT/US2020/043170
§ 371 (c)(1),
(2) Date: Dec. 19, 2022

(87) PCT Pub. No.: WO2022/019909
PCT Pub. Date: Jan. 27, 2022

(65) Prior Publication Data
US 2023/0262933 A1   Aug. 17, 2023

(51) Int. Cl.
*H05K 7/20* (2006.01)
(52) U.S. Cl.
CPC ..... *H05K 7/20336* (2013.01); *H05K 7/20381* (2013.01); *H05K 7/20409* (2013.01); *H05K 7/20454* (2013.01)
(58) Field of Classification Search
CPC ........... H05K 7/20336; H05K 7/20381; H05K 7/20409; H05K 7/20454
See application file for complete search history.

(56) References Cited

U.S. PATENT DOCUMENTS 5,588,483 A   12/1996   Ishida
8,559,173 B2  10/2013   Fujiwara et al.
(Continued)

FOREIGN PATENT DOCUMENTS

| CN | 102117110 A | 7/2011 |
| CN | 208156595 U | 11/2018 |
| JP | 2013-004708 A | 1/2013 |

OTHER PUBLICATIONS

Suzuki JP2013004708 Machine Translation.*
Peng CN 208156595 Machine Translation.*

*Primary Examiner* — Jacob R Crum
(74) *Attorney, Agent, or Firm* — Shook, Hardy & Bacon L.L.P.

(57) ABSTRACT

The present disclosure describes thermal management devices. In one example, a thermal management device can include a processing unit, a thermal grease layer directly contacting the processing unit, and a heat pipe. The heat pipe can include a heat pipe interior volume having a working fluid disposed therein, a first exterior surface directly contacting the thermal grease layer, a second exterior surface opposite from the first exterior surface, and side exterior surfaces connecting the first exterior surface and the second exterior surface. The thermal management device can also include a device cover spaced from the second exterior surface of the heat pipe by a distance from greater than 1 mm to about 5 mm, and a bracket having a clamping portion that holds the heat pipe by the side exterior surfaces of the heat pipe. The clamping portion does not extend past the first exterior surface of the heat pipe.

14 Claims, 3 Drawing Sheets

(56) References Cited

U.S. PATENT DOCUMENTS

| | | |
|---|---|---|
| 9,436,227 B2 | 9/2016 | Kotaka et al. |
| 10,379,583 B2 | 8/2019 | Allin et al. |
| 10,409,340 B2 | 9/2019 | Jin et al. |
| 2006/0060328 A1 | 3/2006 | Ewes et al. |
| 2007/0251670 A1* | 11/2007 | Peng .................... H01L 23/467 165/80.4 |
| 2011/0114294 A1* | 5/2011 | Degner ................ H05K 7/2039 165/185 |
| 2012/0222836 A1* | 9/2012 | Huang ................... F28D 15/02 165/67 |
| 2015/0330715 A1* | 11/2015 | Yu ....................... F28D 15/0233 29/890.03 |
| 2016/0037684 A1 | 2/2016 | Kim et al. |
| 2017/0242462 A1 | 8/2017 | Fujiwara |
| 2022/0336320 A1* | 10/2022 | He .......................... H01L 21/50 |

\* cited by examiner

THERMAL MANAGEMENT DEVICES

BACKGROUND

Electronic devices and circuitry can generate excess heat. Appropriate heat management can increase reliability of electronic devices and can prevent premature failure. Accordingly, a variety of heat transfer methodologies have been developed to manage the excess heat generated by these electronic devices and circuitry. Non-limiting examples can include heat sinks, cold plates, convective air cooling, forced air cooling, heat pipes, Peltier cooling plates, etc.

As one specific example, a heat pipe can operate on the principle of repeated or continuous evaporation and condensation of a working fluid. More specifically, heat input vaporizes a liquid component of the working fluid inside an evaporator section of the heat pipe. The vapor flows towards the colder condenser section of the heat pipe, where the vapor condenses and gives up its latent heat. The condensed liquid returns to the evaporator and the two-phase flow circulation continues while a temperature gradient is maintained between the evaporator and the condenser.

DETAILED DESCRIPTION

Figure 1:
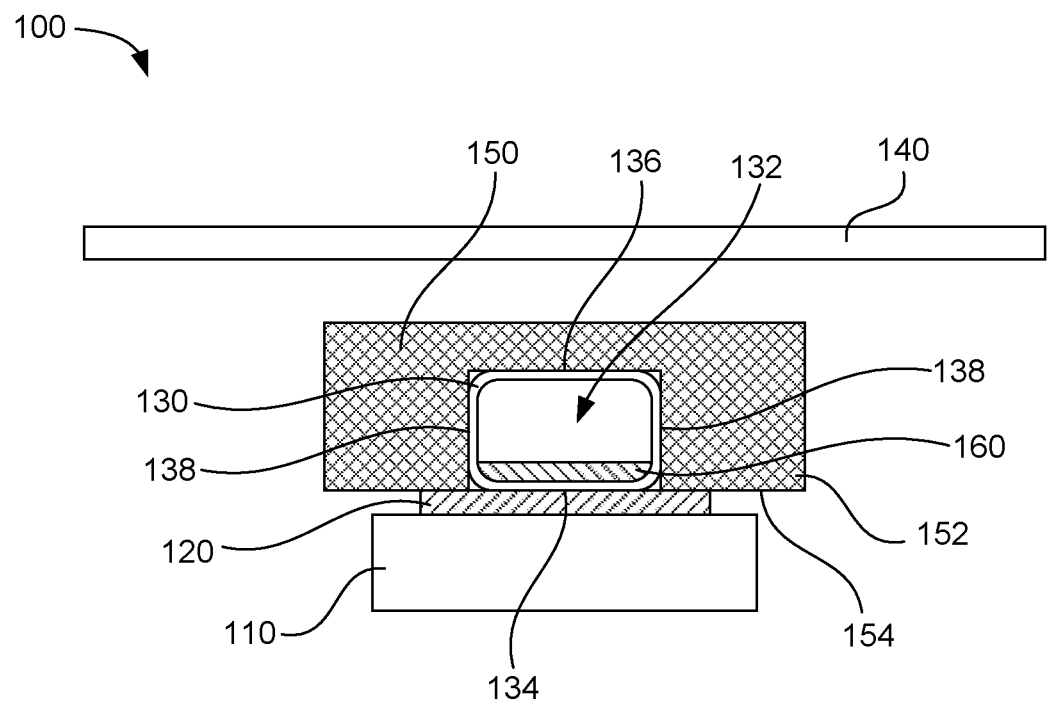
FIG. 1 is a cross-sectional view of an example thermal management device in accordance with examples of the present disclosure.

The present disclosure describes thermal management devices for electronic devices. In one example, a thermal management device includes a processing unit, a thermal grease layer directly contacting the processing unit, and a heat pipe. The heat pipe includes a heat pipe interior volume having a working fluid disposed therein, a first exterior surface directly contacting the thermal grease layer, a second exterior surface opposite from the first exterior surface, and side exterior surfaces connecting the first exterior surface and the second exterior surface. The thermal management device also includes a device cover spaced from the second exterior surface of the heat pipe by a distance from greater than 1 mm to about 5 mm. The thermal management device also includes a bracket having a clamping portion that holds the heat pipe by the side exterior surfaces of the heat pipe, wherein the clamping portion does not extend past the first exterior surface of the heat pipe. In some examples, the processing unit can be a central processing unit, a graphics processing unit, a signal processor, memory, a hard drive, or a combination thereof. In certain examples, the processing unit can be a central processing unit, and the device can also include a graphics processing unit and a second thermal grease layer directly contacting the graphics processing unit, and the first exterior surface of the heat pipe can directly contact the second thermal grease layer. In further examples, the thermal grease layer can have a thickness from about 0.03 mm to about 0.2 mm. In still further examples, the thermal grease layer can include a resin and from about 5 wt % to about 30 wt % of a thermally conductive powder. In particular examples, the resin can include an acrylic-based resin, a natural rubber-based resin, a styrene-butadiene rubber-based resin, a styrenic block copolymer-based resin, a silicone-based resin, an epoxy resin, a polyurethane acrylate resin, or a combination thereof, and the thermally conductive powder can include copper, aluminum, graphite, graphene, aluminum nitride, boron nitride, beryllium oxide, silicon carbide, or a combination thereof. In other examples, the clamping portion of the bracket can extend to the first exterior surface of the heat pipe such that the bracket has a surface flush with the first exterior surface of the heat pipe. In still further examples, the thermal management device can include a heat sink thermally connected to the heat pipe.

The present disclosure also describes electronic devices. In one example, an electronic device includes a device cover, a printed circuit board enclosed within the device cover, a processing unit on the printed circuit board, a thermal grease layer directly contacting the processing unit, and a heat pipe. The heat pipe includes a heat pipe interior volume having a working fluid disposed therein, a first exterior surface directly contacting the thermal grease layer, a second exterior surface opposite from the first exterior surface, wherein the device cover is spaced from the second exterior surface of the heat pipe by a distance from greater than 1 mm to about 5 mm, and side exterior surfaces connecting the first exterior surface and the second exterior surface. The electronic device also includes a bracket having a clamping portion that holds the heat pipe by the side exterior surfaces of the heat pipe, wherein the clamping portion does not extend past the first exterior surface of the heat pipe. In some examples, the electronic device can be a laptop computer, a tablet computer, a workstation, a smart phone, or a television. In further examples, the thermal grease layer can have a thickness from about 0.03 mm to about 0.2 mm. In still further examples, the clamping portion of the bracket can extend to the first exterior surface of the heat pipe such that the bracket has a surface flush with the first exterior surface of the heat pipe.

The present disclosure also describes methods of making electronic devices. In one example, a method of making an electronic device includes attaching a heat pipe to a processing unit using a thermal grease layer in direct contact with the processing unit and the heat pipe. The heat pipe includes a heat pipe interior volume having a working fluid disposed therein, a first exterior surface directly contacting the thermal grease layer, a second exterior surface opposite from the first exterior surface, and side exterior surfaces connecting the first exterior surface and the second exterior surface. The method also includes supporting the heat pipe with a bracket having a clamping portion that holds the heat pipe by the side exterior surfaces of the heat pipe, wherein the clamping portion does not extend past the first exterior surface of the heat pipe. The method also includes covering the processing unit and heat pipe with a device cover spaced from the second exterior surface of the heat pipe by a distance from greater than 1 mm to about 5 mm. In some examples, the thermal grease layer can have a thickness from about 0.03 mm to about 0.2 mm. In further examples, the clamping portion of the bracket extends to the first exterior surface of the heat pipe such that the bracket has a surface flush with the first exterior surface of the heat pipe.

It is noted that when discussing the thermal management devices, electronic devices including the thermal management devices, and methods described herein, these discussions can be considered applicable to one another whether or not they are explicitly discussed in the context of that example. Thus, for example, when discussing a thermal grease related to a thermal management device, such disclosure is also relevant to and directly supported in the context of methods and electronic devices, vice versa, etc.

It is also understood that terms used herein will take on their ordinary meaning in the relevant technical field unless specified otherwise. In some instances, there are terms defined more specifically throughout the specification or included at the end of the present specification, and thus, these terms have a meaning as described herein.

Thermal Management Devices

Many electronic devices include components that generate heat during operation. Central processing units (CPUs), graphics processing units (GPUs), memory, batteries, power supplies, and other components can produce excess heat. In some cases, heat built up in these components can lead to decreased performance or permanent damage to the components. Accordingly, electronic devices can include systems to remove excess heat from these components. In some examples, electronic devices can include heat pipes. Heat pipes are a type of heat conducting device that can be thermally connected to an electronic component that produces heat while the electronic device is running. The heat pipe can contain a working fluid that can evaporate in a section of the heat pipe near the hot electronic component. This evaporation can draw heat out of the electronic component. The vapor can then flow to a colder section of the heat pipe, where the vapor can condense. In some cases, the colder section of the heat pipe can be connected to a heat sink for dissipating the heat that is conducted by the heat pipe.

Some electronic devices are designed with a heat pipe that conducts heat away from a processor. In certain designs, the heat pipe can be connected to a metal plate such as a copper plate, and the metal plate can be connected to the processor. In a particular design, the metal plate can be connected to the processor by a layer of thermal grease between the metal plate and the processor, and the metal plate can be connected to the heat pipe by solder. Heat from the processor can be conducted through the metal plate to the heat pipe, where the heat can be transported and dissipated by the working fluid in the heat pipe.

The thermal management devices described herein can be different from other designs, in that the thermal management devices described herein can include a heat pipe that is connected to a processing unit using a layer of thermal grease, without an additional metal placed between the heat pipe and the processing unit. In particular, a layer of thermal grease can be applied between the processing unit and a surface of the heat pipe. Thus, heat can be conducted from the processing unit to the heat pipe through the thermal grease layer. Compared to the designs that include a metal plate between the heat pipe and the processing unit, the devices described herein can have fewer interfaces between different materials. When heat is conducted through multiple different materials, a temperature drop can be present at interfaces between different materials. This can be referred to as thermal contact resistance. The amount of resistance can depend upon the particular materials on either side of the interface. In the designs that include the metal plate, there can be thermal contact resistance between the processing unit and the thermal grease layer, and between the thermal grease layer and the metal plate, and between the metal plate and the solder layer, and between the solder layer and the heat pipe. These interfaces can reduce the rate of transfer from the processing unit to the heat pipe. The thermal management devices described herein, however, can have lower thermal resistance because there are few interfaces between the processing unit and the heat pipe. In the devices described herein, there can be an interface between the processing unit and the thermal grease layer, and between the thermal grease layer and the heat pipe. In some examples, the thermal grease layer can effectively reduce the total thermal resistance compared to the case where the heat pipe is placed directly in contact with the processing unit, without any thermal grease layer. Therefore, the thermal management devices described herein can have low thermal resistance and the ability to conduct heat away from the processing unit quickly to keep the processing unit at the lower temperature compared to other designs.

In further examples, the heat pipe can be secured using a bracket designed to allow the heat pipe to directly contact the thermal grease layer on the processor. In some examples, the heat pipe can have side surfaces, and the bracket can include a clamping portion that holds the heat pipe by the side surfaces. The clamping portion can be designed so that it does not extend past the surface of the heat pipe that contacts the thermal grease layer. Therefore, the bracket does not get in the way of connecting the heat pipe to the processing unit by the thermal grease layer. In some examples, the bracket can have a surface that is flush with the surface of the heat pipe.

Connecting the heat pipe directly to the processing unit through the thermal grease layer can also reduce the total thickness of the thermal management device, compared to designs that include a metal plate between the heat pipe and the processing unit. For example, if a metal plate is used that has a thickness of 1 mm, then removing the metal plate can effectively reduce the thickness of the thermal management device by 1 mm. In some examples, this can increase a distance between the heat pipe and an outer housing of an electronic device. In some electronic devices, such as laptops, the heat pipe can be inside the device cover or housing, but near the cover so that heat can radiate from the heat pipe to the cover. Therefore, in some cases a hot spot can develop on the outside of the cover in locations where the heat pipe is near the cover. Increasing the distance between the heat pipe and the cover can reduce the transfer of heat to the cover and allow heat to diffuse across a larger area of the cover, thereby reducing the exterior temperature of the cover. This can be particularly useful for devices such as laptops, which may be resting on the lap of a user and may be uncomfortable to use if the cover is too hot. In some examples, the heat pipe can be positioned so that there is a distance from greater than about 1 mm to about 5 mm between the heat pipe and the cover. In further examples, the distance between the heat pipe and the cover can be from greater than about 1 mm to about 2 mm, or from greater than about 1 mm to about 1.5 mm.

With this description in mind, FIG. 1 shows a cross-sectional view of an example thermal management device 100 in accordance with the present disclosure. The thermal management device includes a processing unit 110, a thermal grease layer 120 directly contacting the processing unit, a heat pipe 130, a device cover 140, and a bracket 150. This figure shows a cross-section in which the heat pipe is cut along a plane perpendicular to the length axis of the heat pipe, so that the interior volume 132 is shown. A working fluid 160 is disposed within the interior volume. The heat pipe includes a first exterior surface 134 that directly contacts the thermal grease layer, a second exterior surface 136 that is opposite from the first exterior surface, and side exterior surfaces 138 connecting the first exterior surface and the second exterior surface. The device cover is spaced apart from the second exterior surface of the heat pipe by a spacing distance. In some examples, the spacing distance can be from greater than about 1 mm to about 5 mm. The bracket can include a clamping portion 152 that holds the heat pipe by the side exterior surfaces of the heat pipe. The clamping portion does not extend past the first exterior surface of the heat pipe. In this particular example, the clamping portion extends to the first exterior surface of the heat pipe so that the bracket has a surface 154 that is flush with the first exterior surface of the heat pipe.

Figure 2:
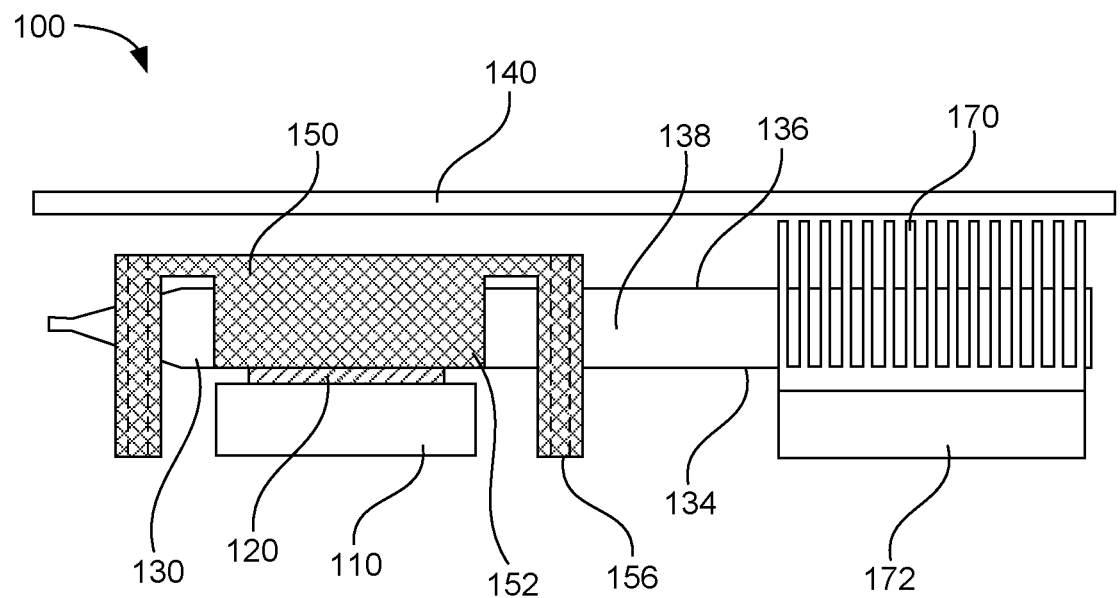
FIG. 2 is a side view of an example thermal management device in accordance with examples of the present disclosure.

FIG. 2 shows another example thermal management device 100. This example is shown from a side (not cross-sectional) view. As in the example of FIG. 1, this example includes a processing unit 110 in contact with a thermal grease layer 120 and a heat pipe 130 having a first exterior surface 134 that is in contact with the thermal grease layer. The heat pipe also has a second exterior surface 136 that is opposite from the first exterior surface, and side exterior surfaces 138 that connect the first and second exterior surfaces. A device cover 140 is spaced apart from the second exterior surface of the heat pipe by a distance from greater than about 1 mm to about 5 mm. The heat pipe is secured by a bracket 150 that has a clamping portion 152 holding the side exterior surfaces of the heat pipe. The bracket in the example also includes screw holes 156 to connect the bracket to a printed circuit board or other components that may be in the electronic device. Also, this example thermal management device includes a heat sink 170 connected to a far end of the heat pipe, and a fan 172 to blow air across the heat sink. The heat pipe can conduct heat from the processing unit to the heat sink, where the heat can be dissipated into the air blown by the fan.

The thermal management devices described herein can be used to conduct heat away from a variety of processing units, which can generate heat during operation. In some examples, the processing unit can be a processor, such as a central processing unit (CPU), a graphics processing unit (GPU), a signal processor, or another type of processor. In other examples, the processing unit can be another electronic component that generates heat, such as a hard drive or memory, such as random access memory (RAM).

Figure 3:
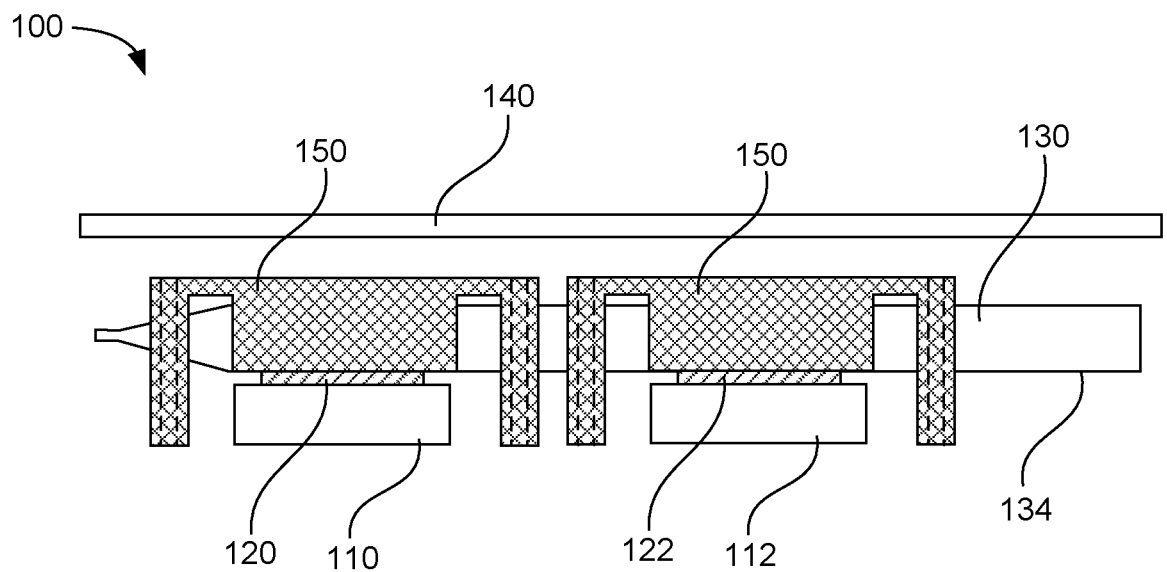
FIG. 3 is a side view of another example thermal management device in accordance with examples of the present disclosure.

In certain examples, a thermal management device can include multiple processing units. In some such examples, a single heat pipe can be used to conduct heat away from the multiple processing units. In certain examples, a heat pipe can conduct heat away from both a CPU and a GPU. FIG. 3 shows one such example thermal management device 100, which includes both a CPU 110 and a GPU 112. A first thermal grease layer 120 is in direct contact with the CPU, and a second thermal grease layer 122 is in direct contact with the GPU. A heat pipe 130 has a first exterior surface 134 that contacts both the first thermal grease layer and the second thermal grease layer. Therefore, the heat pipe can conduct heat from both the CPU and the GPU.

The thermal grease layer can be formed by applying thermal grease to the processing unit or to the surface of the heat pipe and then pressing the heat pipe and the processing unit together. In some examples, the thermal grease layer can include a polymeric resin and a thermally conductive powder. In certain examples, the amount of polymeric resin in the thermal grease can be from about 5 wt % to about 30 wt % based on the total weight of the thermal grease layer. In other examples, the amount of polymeric resin can be from about 5 wt % to about 20 wt %, or from about 5 wt % to about 10 wt %, or from about 10 wt % to about 20 wt %, or from about 20 wt % to about 30 wt %.

Non-limiting examples of resins that can be used in the thermal grease layer include acrylic-based resins, natural rubber-based resins, styrene-butadiene rubber-based resins, styrenic block copolymer-based resins, silicone-based resins, epoxy resins, polyurethane acrylate resins, and combinations thereof.

Non-limiting examples of thermally conductive powders that can be used in the thermal grease layer include copper powder, aluminum powder, graphite powder, graphene powder, aluminum nitride powder, boron nitride powder, beryllium oxide powder, silicon carbide powder, or a combination thereof. In various examples, the thermally conductive powder can be included in the thermal grease layer in an amount from about 30 wt % to about 95 wt %, or from about 30 wt % to about 75 wt %, or from about 30 wt % to about 50 wt %, or from about 50 wt % to about 95 wt %, or from about 75 wt % to about 95 wt %. In certain examples, the thermal grease can consist of the thermally conductive powder and the resin.

The thermal grease layer can have a thickness that can vary depending on how close the heat pipe is to the processing unit. In some examples, the thickness of the thermal grease layer can be from about 0.03 mm to about 0.2 mm. In certain examples, the thermal grease layer can be in direct contact with the processing unit and the surface of the heat pipe without being in direct contact with any other components. In other examples, the thermal grease layer can be in contact with the processing unit, the heat pipe, and a surface of the bracket holding the heat pipe.

As mentioned above, the heat pipe can include an interior volume with a working fluid inside the interior volume. The interior volume can be enclosed by walls of the heat pipe. The first exterior surface, second exterior surface, and side exterior surfaces mentioned above can be the exterior surfaces of these walls. In some examples, the walls of the heat pipe can be in the form of a tube or pipe. The transitions between the side exterior surfaces and the first and second exterior surfaces can be at abrupt corners, in some examples, or smoothly curved transitions in other examples. In certain examples, the first exterior surface can include a flat section that can be in contact with the layer of thermal grease on the processing unit. In further examples, the second exterior surface and/or the side exterior surfaces can also have flat sections. However, other examples can include a second exterior surface and/or side exterior surfaces that are curved. Heat pipes can have a variety of cross-sectional shapes. For example, heat pipes can be circular tubes, square tubes, rectangular tubes, rounded oblong tubes, or other shapes. In further examples, the ends of the heat pipe can be crimped, soldered, or welded shut to seal the working fluid within the interior volume.

In some examples, the walls of the heat pipe can be made from a copper-containing material or an aluminum-containing material. In some examples, the material can be pure aluminum metal, an alloy of aluminum with another metal or metals, an alloy of aluminum with copper, or an alloy including aluminum, copper, and another metal or metals. In certain examples, the walls can include an alloy of aluminum and copper. The alloy can include aluminum in an amount from about 55 wt % to about 90 wt % and copper in an amount from about 10 wt % to about 45 wt %.

In some examples, the walls of the heat pipe can be relatively thin. In some examples, a micro-arc oxidation layer can be formed on interior surfaces of the walls. This oxidation layer can have a high stiffness, which in some examples can allow the overall thickness of the walls to be decreased without sacrificing mechanical strength. In some examples, the walls can have an average thickness from about 150 μm to about 1 mm. In further examples, the walls can have an average thickness from about 200 μm to about 1 mm, or from about 500 μm to about 1 mm, or from about 150 μm to about 800 μm, or from about 150 μm to about 500 μm. In further examples, the walls can have a thickness at the thinnest part of the walls that is from about 150 μm to about 1 mm.

The heat pipe can have a variety of dimensions depending on the size of the electronic devices in which the heat pipe is to be used. In some examples, the heat pipe can have an outer diameter or outer width from about 1 mm to about 5 mm, or from about 1 mm to about 3 mm, or from about 1.5 mm to about 5 mm, or from about 1.5 mm to about 3 mm, or from about 1.2 mm to about 1.5 mm. The inner diameter, or the shortest dimension of the interior cavity, can be from about 200 μm to about 1.2 mm, or from about 200 μm to about 1 mm, or from about 200 μm to about 800 μm, in some examples.

The heat pipe can have a length sufficient to run from the processing unit that produces heat to a heat sink that dissipates heat. In some examples, the length of the heat pipe can be from about 50 mm to about 500 mm. In further examples, the length of the heat pipe can be from about 50 mm to about 150 mm, from about 100 mm to about 200 mm, from about 150 mm to about 250 mm, from about 200 mm to about 300 mm, from about 250 mm to about 350 mm, from about 300 mm to about 400 mm, from about 350 mm to about 450 mm, or from about 400 mm to about 500 mm. The overall thermal conductivity of the heat pipe can depend on the length of the heat pipe. In some examples, depending on the length of the heat pipe and the metal used in the walls of the heat pipe, the heat pipe can have a thermal conductivity of from about 10,000 W/mK to about 100,000 W/mK, for example.

A working fluid can be sealed within the interior volume of the heat pipe. A variety of working fluids can be employed in the heat pipe. Working fluids can be chosen based on the temperature at which the heat pipe is intended to operate. For example, the working fluid can be selected from fluids that are compatible with the metal forming the walls of the heat pipe, and that will provide both a vapor phase and a liquid phase over the intended operating temperature range. Additionally, the working fluid can typically have a high latent heat of evaporation. In some examples, the working fluid can have a latent heat of evaporation of from about 800 kilojoules per kilogram (kJ/kg) to about 2500 kJ/kg. In some further examples, the working fluid can have a latent heat of evaporation of from about 800 kJ/kg to about 1500 kJ/kg, from about 1200 kJ/kg to about 1800 kJ/kg, from about 1500 kJ/kg to about 2000 kJ/kg, from about 1800 kJ/kg to about 2200 kJ/kg, or from about 2000 kJ/kg to about 2500 kJ/kg.

In some specific examples, the working fluid can be or include water, ammonia, methanol, ethanol, glycerol, the like, or a combination thereof. In some examples, the working fluid can be or include water. In some additional examples, the working fluid can be or include ammonia. In yet additional examples, the working fluid can be or include methanol. In still additional examples, the working fluid can be or include ethanol. In some further examples, the working fluid can be or include glycerol. It is noted that not all working fluids are compatible with all thermally conductive materials. For example, a water working fluid may not be compatible with a heat pipe formed of pure aluminum. However, a water working fluid can be compatible with a heat pipe formed of an alloy of aluminum and copper and an ammonia working fluid can be compatible with a vapor chamber formed of aluminum, for example. In certain examples, the interior cavity of the heat pipe can be evacuated before the working fluid is introduced and sealed inside the cavity. Thus, the cavity can be occupied by the working fluid liquid and vapor without any air or other materials, in some examples.

As mentioned above, the heat pipe can be supported by a bracket that is designed to hold the heat pipe by the side exterior surfaces of the heat pipe without obstructing the connection between the heat pipe, thermal grease layer, and processing unit. The bracket can have a clamping portion that holds the side exterior surfaces of the heat pipe. The heat pipe can have a first surface that is in contact with the thermal grease layer on the processing unit, and the clamping portion of the bracket can be designed so that the clamping portion does not extend past the first exterior surface of the heat pipe. In certain examples, the clamping portion can have a surface that is flush with the first exterior surface of the heat pipe.

In some examples, the clamping portion of the bracket can apply pressure to the side exterior surfaces of the heat pipe to hold the heat pipe in place. In other examples, the clamping portion can hold the heat pipe in place without applying pressure to the heat pipe. For example, the bracket can include a cover portion that covers the second exterior surface of the heat pipe, and the heat pipe can be constrained between the cover portion of the bracket, the clamping portion of the bracket, and the processing unit. The bracket can also include additional features, such as screw holes, clips, tabs, or other features to allow the bracket to be attached to another component in the electronic device. In some examples, the bracket can be attached to a printed circuit board on which the processing unit is located. In other examples the bracket can be attached to the cover of the electronic device.

In various examples, the bracket can be made from a variety of materials, such as metal, plastic, carbon fiber, ceramic, or others. In some examples, the bracket can be made of similar materials as the heat pipe. In further examples, the bracket can include steel, aluminum, magnesium, titanium, copper, or an alloy thereof.

Electronic Devices

The thermal management devices described above can be incorporated into a variety of electronic devices. Non-limiting examples can include a display, an amplifier, a memory device, a server, a modem, a router, a personal computer, a workstation, a laptop computer, a tablet, a phone, a speaker, a television, a media player, a projector, a smart device, or a combination thereof.

In further detail, the electronic device can include a processing unit. In various examples, the processing unit can be a component that generates heat during operation of the electronic device. For example, with demands for increased speeds and smaller sizes of electronic devices, microprocessors are becoming smaller with more compressed cores. This can cause higher rates of heat generation per unit area of the microprocessor. As another example, temperatures can increase with smaller transistor designs because smaller channel dimensions can increase the power density and electron-phonon non-equilibrium within devices, for example. Further still, increasing temperatures can result from increasing numbers of metal layers in interconnects between transistors, resulting in increased current densities and aspect ratios. Thus, a variety of components, including increasingly smaller components, in electronic devices can generate high amounts of heat that can benefit from thermal management.

In some examples, the electronic device can include a printed circuit board. The processing unit can be located on the printed circuit board. In certain examples, the processing unit can be soldered to the printed circuit board, or held in a socket on the printed circuit board. A layer of thermal grease can be in direct contact with the processing unit and a heat pipe can be in contact with the thermal grease layer to conduct heat away from the processing unit. The electronic device can also include a cover that encloses the printed circuit board, processing unit, and heat pipe.

In some examples, multiple covers can be used to enclose internal electronic components. Therefore, electronic components can be referred to as being "enclosed within" a cover if a single-piece cover encloses the component, or if multiple cover pieces enclose the component. For example, a device such as a smart phone, tablet computer, or television can include a front cover and a back cover. Internal components such as processors, printed circuit boards, batteries, display screens, and others can be placed between the front cover and back cover so that the covers enclose the electronic components. In another particular example, the electronic device can be a laptop computer that includes a keyboard portion and a monitor portion connected by a hinge. Laptop covers sometimes include four separate cover pieces. The four separate laptop covers are often designated as cover A (a housing that is placed over the back of the monitor portion of the laptop), cover B (a housing placed over the front of the monitor portion), cover C (a housing that is placed on the top of the keyboard portion) and cover D (a housing that is placed on the bottom of the keyboard portion).

As mentioned above, the heat pipe can have a first exterior surface in contact with the thermal grease layer on the processing unit, and a second exterior surface that is spaced apart from a cover at a distance from greater than about 1 mm to about 5 mm. When the heat pipe is 1 mm or closer to the cover, the cover may develop a hot spot on the exterior surface of the electronic device. In a certain example, the electronic device can be a laptop computer, and the cover can be the "cover D," which is on the bottom of the keyboard portion of the laptop. Therefore, the cover can often be placed in contact with the skin of the user when the laptop sits on the lap of the user. Including a sufficient spacing distance between the heat pipe and the cover on the bottom of the laptop computer can help reduce the temperature of the cover, making the laptop computer more comfortable to use.

Figure 4:
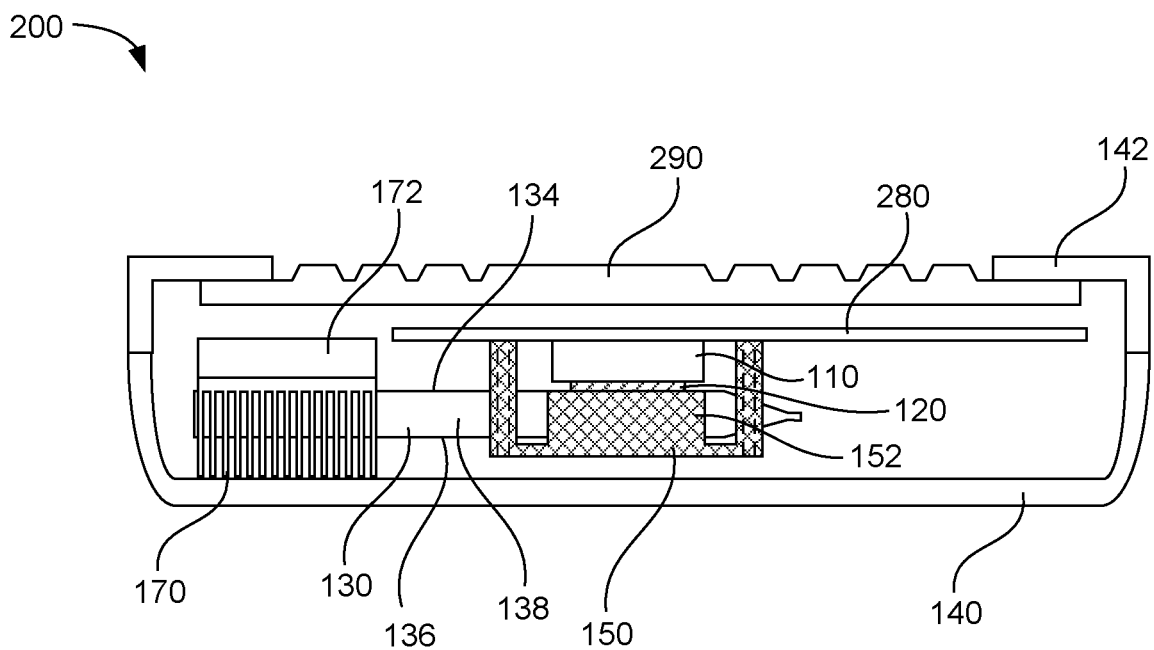
FIG. 4 is a side and cross-sectional view of an example electronic device in accordance with examples of the present disclosure.

FIG. 4 shows an example electronic device 200. In this example, the electronic device is a laptop computer, and a schematic of the bottom keyboard portion of the laptop is shown. The bottom of the laptop is covered by a cover D 140. A cover C 142 covers the top of the keyboard portion of the laptop. A printed circuit board 280 is enclosed within the device covers. A processing unit (CPU) 110 is on the printed circuit board. In this example, the processing unit is located on the bottom of the printed circuit board when the laptop is oriented to be used by a user. A thermal grease layer 120 is in direct contact with the processing unit. A heat pipe 130 has a first exterior surface 134 in contact with the thermal grease layer. A second exterior surface 136 is opposite from the first exterior surface. The second exterior surface is separated from the cover D by a spacing distance from greater than about 1 mm to about 5 mm. The electronic device also includes a bracket 150 that has a clamping portion 152 that holds the heat pipe by side exterior surfaces 138 of the heat pipe. The clamping portion of the bracket does not extend past the first exterior surface of the heat pipe. In this example, the heat pipe leads to a heat sink 170 with a fan 172 to blow air across the heat sink. A keyboard 290 is also shown in this example. The keyboard is exposed through openings in the cover C.

Methods of Making Electronic Devices

The present disclosure also describes methods of making electronic devices. The methods can be used to make electronic devices that include thermal management devices having any of the characteristics described above. In some examples, methods can include assembling the components in the arrangements described above, such as applying thermal grease between a processing unit and a heat pipe, supporting the heat pipe with a bracket, and placing a device cover at an appropriate distance from the heat pipe.

Figure 5:
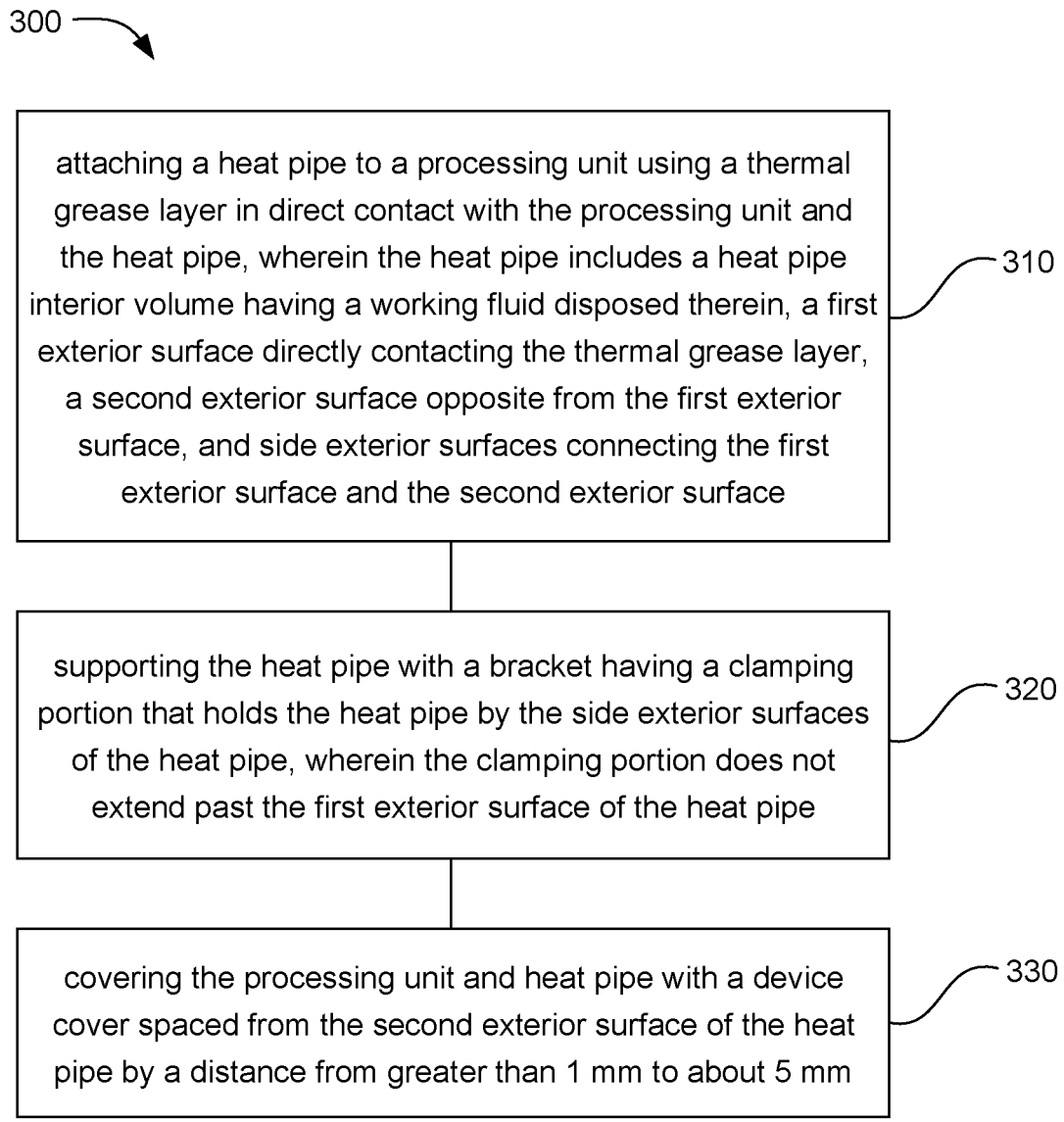
FIG. 5 is a flowchart illustrating an example method of making an electronic device in accordance with examples of the present disclosure.

FIG. 5 is a flowchart illustration of one example method 300 of making an electronic device. The method includes: attaching a heat pipe to a processing unit using a thermal grease layer in direct contact with the processing unit and the heat pipe, wherein the heat pipe includes a heat pipe interior volume having a working fluid disposed therein, a first exterior surface directly contacting the thermal grease layer, a second exterior surface opposite from the first exterior surface, and side exterior surfaces connecting the first exterior surface and the second exterior surface 310; supporting the heat pipe with a bracket having a clamping portion that holds the heat pipe by the side exterior surfaces of the heat pipe, wherein the clamping portion does not extend past the first exterior surface of the heat pipe 320; and covering the processing unit and heat pipe with a device cover spaced from the second exterior surface of the heat pipe by a distance from greater than about 1 mm to about 5 mm 330.

Definitions

It is noted that, as used in this specification and the appended claims, the singular forms "a," "an," and "the" include plural referents unless the content clearly dictates otherwise.

As used herein, the term "about" is used to provide flexibility to a numerical range endpoint by providing that a given value may be "a little above" or "a little below" the endpoint. The degree of flexibility of this term can be dictated by the particular variable based on experience and the associated description herein.

As used herein, a plurality of items, structural elements, compositional elements, and/or materials may be presented in a common list for convenience. However, these lists should be construed as though individual members of the list are individually identified as a separate and unique member. Thus, no individual member of such list should be construed as a de facto equivalent of any other member of the same list solely based on their presentation in a common group without indications to the contrary.

Concentrations, dimensions, amounts, and other numerical data may be presented herein in a range format. It is to be understood that such range format is used merely for convenience and brevity and should be interpreted flexibly to include the numerical values explicitly recited as the limits of the range, and also all the individual numerical values or sub-ranges encompassed within that range as if individual numerical values and sub-ranges are explicitly recited. For example, an atomic ratio range of about 1 at % to about 20 at % should be interpreted to include the explicitly recited limits of about 1 at % and about 20 at %, and also to include individual atomic percentages such as 2 at %, 11 at %, 14 at %, and sub-ranges such as 10 at % to 20 at %, 5 at % to 15 at %, etc.

The terms, descriptions, and figures used herein are set forth by way of illustration and are not meant as limitations. Many variations are possible within the disclosure, which is intended to be defined by the following claims—and equivalents—in which all terms are meant in the broadest reasonable sense unless otherwise indicated.

EXAMPLES

The following illustrates examples of the present disclosure. However, it is to be understood that the following are merely illustrative of the application of the principles of the present disclosure. Numerous modifications and alternative devices, methods, and systems may be devised without departing from the spirit and scope of the present disclosure. The appended claims are intended to cover such modifications and arrangements.

Example 1—Thermal Management Device

An example thermal management device is made by the following procedure. A thermal grease that includes a silicone resin and aluminum powder is applied to a CPU. A heat pipe is then pressed against the CPU with the thermal grease layer between the CPU and the heat pipe. The heat pipe is a square tube made of a copper and aluminum alloy with water in the interior volume as a working fluid. The ends of the heat pipe are welded closed. A steel bracket is pressure fitted on the heat pipe, with clamping portions of the bracket that extend down the side exterior surfaces of the heat pipe. The clamping portions of the bracket extend to be flush with the surface of the heat pipe that is in contact with the thermal grease layer on the CPU. A cover is then placed at a distance from greater than 1 mm to about 5 mm away from the heat pipe.

Example 2—Electronic Device

An electronic device is made by incorporating the thermal management device described in Example 1 with additional components to form an electronic device. The CPU is placed on a printed circuit board. A heat sink is also added at the far end of the heat pipe, so that the heat conducted by the heat pipe is dissipated by the heat sink. The printed circuit board, CPU, heat pipe, bracket, and heat sink are enclosed within the cover.

What is claimed is:

1. A thermal management device comprising:
   a processing unit;
   a thermal grease layer directly contacting the processing unit;
   a heat pipe comprising:
      a heat pipe interior volume having a working fluid disposed therein,
      a first exterior surface directly contacting the thermal grease layer,
      a second exterior surface opposite from the first exterior surface, and
      side exterior surfaces connecting the first exterior surface and the second exterior surface;
   a device cover spaced from the second exterior surface of the heat pipe by a distance from greater than 1 mm to about 5 mm;
   a bracket having a clamping portion that holds the heat pipe by the side exterior surfaces of the heat pipe, wherein a portion of the clamping portion is in direct contact with the thermal grease layer, and wherein a portion of the bracket is in direct contact with a circuit board coupled to the processing unit; and
   a heat sink thermally connected to the heat pipe, wherein a portion of the heat sink is in contact with the device cover.

2. The thermal management device of claim 1, wherein the processing unit is a central processing unit, a graphics processing unit, a signal processor, memory, a hard drive, or a combination thereof.

3. The thermal management device of claim 1, wherein the processing unit is a central processing unit, wherein the thermal management device further comprises a graphics processing unit and a second thermal grease layer directly contacting the graphics processing unit, and wherein the first exterior surface of the heat pipe directly contacts the second thermal grease layer.

4. The thermal management device of claim 1, wherein the thermal grease layer has a thickness from about 0.03 mm to about 0.2 mm.

5. The thermal management device of claim 1, wherein the thermal grease layer comprises a resin and from about 5 wt % to about 30 wt % of a thermally conductive powder.

6. The thermal management device of claim 5, wherein the resin comprises an acrylic-based resin, a natural rubber-based resin, a styrene-butadiene rubber-based resin, a styrenic block copolymer-based resin, a silicone-based resin, an epoxy resin, a polyurethane acrylate resin, or a combination thereof, and wherein the thermally conductive powder comprises copper, aluminum, graphite, graphene, aluminum nitride, boron nitride, beryllium oxide, silicon carbide, or a combination thereof.

7. The thermal management device of claim 1, wherein the clamping portion of the bracket extends to the first exterior surface of the heat pipe such that the bracket has a surface flush with the first exterior surface of the heat pipe.

8. An electronic device comprising:
   a device cover;
   a printed circuit board enclosed within the device cover;
   a processing unit on the printed circuit board;
   a thermal grease layer directly contacting the processing unit;
   a heat pipe comprising:
      a heat pipe interior volume having a working fluid disposed therein,
      a first exterior surface directly contacting the thermal grease layer,
      a second exterior surface opposite from the first exterior surface, wherein the device cover is spaced from the second exterior surface of the heat pipe by a distance from greater than 1 mm to about 5 mm, and side exterior surfaces connecting the first exterior surface and the second exterior surface; and
   a bracket having a clamping portion that holds the heat pipe by the side exterior surfaces of the heat pipe, wherein a portion of the clamping portion is in direct contact with the thermal grease layer, and wherein a portion of the bracket is in direct contact with a circuit board coupled to the processing unit; and
   a heat sink coupled to the heat pipe, wherein a portion of the heat sink is in contact with the device cover.

9. The electronic device of claim 8, wherein the electronic device is a laptop computer, a tablet computer, a workstation, a smart phone, or a television.

10. The electronic device of claim 8, wherein the thermal grease layer has a thickness from about 0.03 mm to about 0.2 mm.

11. The electronic device of claim 8, wherein the clamping portion of the bracket extends to the first exterior surface of the heat pipe such that the bracket has a surface flush with the first exterior surface of the heat pipe.

12. A method of making an electronic device comprising:
  attaching a heat pipe to a processing unit using a thermal grease layer in direct contact with the processing unit and the heat pipe, wherein the heat pipe comprises:
    a heat pipe interior volume having a working fluid disposed therein,
    a first exterior surface directly contacting the thermal grease layer,
    a second exterior surface opposite from the first exterior surface, and
    side exterior surfaces connecting the first exterior surface and the second exterior surface;
  supporting the heat pipe with a bracket having a clamping portion that holds the heat pipe by the side exterior surfaces of the heat pipe, wherein a portion of the clamping portion is in direct contact with the thermal grease layer, wherein a portion of the bracket is in direct contact with a circuit board coupled to the processing unit;
  coupling a heat sink to the heat pipe, wherein a portion of the heat sink is in contact with a device cover; and
  covering the processing unit and heat pipe with the device cover spaced from the second exterior surface of the heat pipe by a distance from greater than 1 mm to about 5 mm.

13. The method of claim 12, wherein the thermal grease layer has a thickness from about 0.03 mm to about 0.2 mm.

14. The method of claim 12, wherein the clamping portion of the bracket extends to the first exterior surface of the heat pipe such that the bracket has a surface flush with the first exterior surface of the heat pipe.

* * * * *